(12) United States Patent
Hirose

(10) Patent No.: US 6,654,309 B1
(45) Date of Patent: Nov. 25, 2003

(54) CIRCUIT AND METHOD FOR REDUCING VOLTAGE STRESS IN A MEMORY DECODER

(75) Inventor: Ryan T. Hirose, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/029,371

(22) Filed: Dec. 20, 2001

(51) Int. Cl.[7] .................................. G11C 8/00
(52) U.S. Cl. ..................... 365/230.06; 365/63; 365/72
(58) Field of Search .............................. 365/230.06, 63, 365/72, 51, 230.03, 185.13

(56) References Cited

U.S. PATENT DOCUMENTS

| | | |
|---|---|---|
| 5,391,941 A | 2/1995 | Landry |
| 5,493,241 A | 2/1996 | Landry et al. |
| 5,506,816 A | 4/1996 | Hirose et al. |
| 5,510,638 A | 4/1996 | Lancaster et al. |
| 5,644,533 A | 7/1997 | Lancaster et al. |
| 5,654,915 A | 8/1997 | Stolmeijer et al. |
| 5,656,837 A | 8/1997 | Lancaster et al. |
| 5,661,418 A | 8/1997 | Narayana et al. |
| 5,774,400 A | 6/1998 | Lancaster et al. |
| 5,789,776 A | 8/1998 | Lancaster et al. |
| 5,828,624 A | 10/1998 | Baker et al. |
| 5,892,712 A | 4/1999 | Hirose et al. |
| 5,955,897 A | 9/1999 | Narayana et al. |
| 5,973,545 A | 10/1999 | Raza |
| 6,160,730 A * | 12/2000 | Tooher ..................... 365/63 |
| 6,385,745 B1 | 5/2002 | Grivna |

* cited by examiner

Primary Examiner—David Lam
(74) Attorney, Agent, or Firm—Dorsey & Whitney LLP

(57) ABSTRACT

A circuit for generating an output signal, such as a subword line signal, to one or more memory cells of a memory. In one embodiment, the circuit includes four transistors each with a separate select line. In one example, a first switch is provided and has an input coupled with a global word line input signal; a second switch has an input coupled with the output of the first switch at an output node; a third switch has an input coupled with the global word line input signal and the output of the third switch being coupled with the output of the first switch at the output node; and a fourth switch having an input coupled with the output of the third switch at the output node and the output of the fourth switch is coupled with the output of the second switch.

12 Claims, 2 Drawing Sheets

CIRCUIT AND METHOD FOR REDUCING VOLTAGE STRESS IN A MEMORY DECODER

FIELD OF THE INVENTION

This invention relates to memory decoders of semiconductor memories.

BACKGROUND OF THE INVENTION

In memory systems, non-volatile memories may include subword line decoders which generate a subword line (SWL) output to perform read, erase, or program functions on a portion of the memory. Subword line decoders route different voltages along the subword line to perform the different read, erase or program functions.

In memory systems, there may be multiple subword line decoders per bank of memory. One example of a memory using subword line decoders with subword lines is illustrated in commonly assigned U.S. Pat. No. 5,506,816, issued on Apr. 9, 1996, entitled "Memory Cell Array Having Compact Word Line Arrangement," the disclosure of which is expressly incorporated herein by reference in its entirety.

FIG. 1 shows one example of a subword line decoder 10 having a subword line (SWL) 12. The inputs to the subword line decoder are the P-well line, the source line, the global word line (GWL) 14, the block select line (BKS) and its complement (BKSB). Based on the values of these input signals, the subword line decoder 10 produces an output signal 12 shown as the subword line, which may be passed to the gate of a memory cell (not shown) to perform a read, erase or program operation of the memory cell.

The subword line decoder 10 passes onto the subword line 12 both the full power levels (i.e., +5 volts), as well as other high voltage signals (i.e., −5 volts). A high voltage signal, in this context, includes voltages which are outside of the normal power supply range of the integrated circuit. For example, in a circuit which operates on logic levels of zero to +5 volts, a high voltage signal would include a negative voltage reference of −5 volts, referred to herein as the VNEG signal. While not shown in these figures, it is assumed that the high voltage signal VNEG is generated by a high voltage generating circuit capable of creating a high voltage signal such as −5 volts.

In one example, the VNEG signal of 0 to −5 volts is a high voltage signal used to program or erase the contents of a memory cell. In one example, the VNEG signal is at ground during standby and read operations, and the VNEG signal is pumped or forced to a high voltage negative potential, such as −5 volts, during an erase or program operation in the non-volatile memory.

In FIG. 1, the transistor P1 is a pass transistor that, when a voltage of +5 volts is present on the global word line 14 and transistor P1 is on, transistor P1 passes that voltage to the subword line 12. When the global word line 14 is at −5 volts, transistor N1 acts as a pass transistor which passes the −5 volts of the global word line 14 to the subword line 12. Transistors N2 and P2 provide a deselect path which connects the source line to the subword line 12.

As recognized by the present inventor, in the circuit of FIG. 1 it is possible that the voltages between the gate and the source of the transistors is a high voltage such as +10 volts, which may over the long term degrade the performance of the transistors. For instance, to turn transistors P1 and N1 on (so that the value of the global word line 14 can be passed to the subword line 12) while disabling transistors P2 and N2, the block select line BKS is driven high (i.e., 5 volts) and the BKSB line is low (i.e., −5 volts for an erase and program operation). If the global word line 14 is also at +5 volts during a program operation, then the transistor P1 has a 10 volt bias between its gate and source—such a high gate to source voltage across transistor P1 may degrade the transistor over time. Similarly, if the global word line 14 is at −5 volts for an erase operation, then transistor N1 has a 10 volt bias between its gate and source, which may degrade transistor N1 over time.

As recognized by the present inventor, what is needed is a subword line decoder which can pass signals of read, erase and program operations without subjecting the transistors of the subword line decoder to stresses resulting from the application of high bias voltages to the transistors.

It is against this background that various embodiments of the present invention were developed.

SUMMARY

According to one broad aspect of one embodiment of the present invention, disclosed herein is a subword decoder circuit for generating an output signal, such as a subword line signal, to one or more memory cells of a memory. In one embodiment, the circuit includes four transistors each with a separate select line.

In one example, a first switch is provided and has an input coupled with a global word line input signal; a second switch has an input coupled with the output of the first switch at an output node; a third switch has an input coupled with the global word line input signal and the output of the third switch being coupled with the output of the first switch at the output node; and a fourth switch having an input coupled with the output of the third switch at the output node and the output of the fourth switch is coupled with the output of the second switch. In one embodiment, a first block select line is coupled with the control of said first switch; a second block select line is coupled with the control of the fourth switch. The second block select line may be a complement of the first block select line in one example. A third block select line is coupled with the control of the second switch, and a fourth block select line is coupled with the control of the third switch. The fourth block select line may be a complement of the third block select line.

By providing separate block select line to control the switches, the voltage across the switches is reduced during instances when a high voltage signal is being passed from the global word line to the subword line, or from the source line to the subword line.

In another embodiment, the first switch and the fourth switched can be p-channel transistors. Each p-channel transistor may be formed using a stack of three p-channel transistors, so as to improve the characteristics of the first and fourth switches.

The features, utilities and advantages of various embodiments of the invention will be apparent from the following more particular description of embodiments of the invention as illustrated in the accompanying drawings.

DETAILED DESCRIPTION

Figure 2:
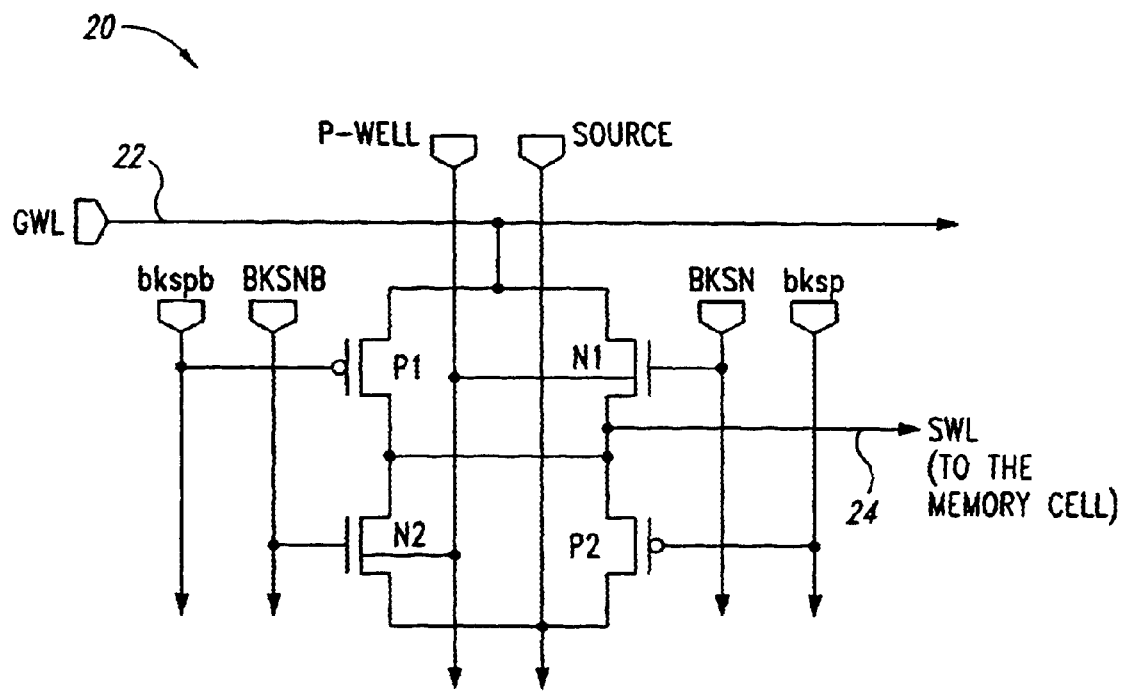
FIG. 2 illustrates a subword line decoder in accordance with one embodiment of the present invention.

FIG. 2 illustrates a diagram of a subword line decoder 20 in accordance with one embodiment of the present invention. In one embodiment, the subword line decoder 20 includes a p-channel transistor P1 connected in series with an n-channel transistor N2. N-channel transistor N1 is connected in parallel, in one example, with transistor P1 so that +5 volts or −5 volts can be passed from the global word line (GWL) 22 to the subword line (SWL) 24 without the loss of a threshold voltage drop.

In accordance with one embodiment of the present invention, separate block select lines are provided for the transistors based on whether the transistor is a p-channel or n-channel transistor. In this manner, the amount of voltage across the gate to source for the transistors is reduced, which thereby reduces the possibility that the transistors will degrade over time, as will be explained below.

As used herein, the term "transistor" or "switch" includes any switching element which can include, for example, n-channel or p-channel CMOS transistors, MOS-FETs, FETS, JFETs, BJTs, or other like switching element or device. The particular type of switching element used is a matter of choice depending on the particular application of the circuit, and may be based on factors such as power consumption limits, response time, noise immunity, fabrication considerations, etc. While embodiments of the present invention are described in terms of p-channel and n-channel transistors, it is understood that other switching devices can be used.

Further, embodiments of the present invention are described in terms of a circuit which utilizes logic levels of 0 volts (logic low) and +5 volts (logic high), where a high voltage signal can include voltages such as −5 volts or +10 volts. It is understood that embodiments of the present invention can be utilized in circuits wherein the voltage levels for the circuits are different, such as in a circuit which utilizes logic levels of 0 volts (logic low) and +3 volts (logic high), where a high voltage signal can include voltages such as −7 volts or +13 volts, in one example.

In accordance with one embodiment of the present invention, the inputs to the subword line decoder 20 of FIG. 2 include the P-well line, the source line, the global word line (GWL) 22, a block select line for the n-channel transistors (BKSN) and its complement (BKSNB), and a block select line for the p-channel transistors (bksp) and its complement (bkspb).

The U.S. Pat. No. 5,506,816, referenced above, generally describes the generation of a block select line signal, which can be generated by a circuit on a per block basis. Referring now to FIG. 2 of the present application, the block select signals BKSN, BKSNB, bksp and bkspb can, in one example, be generated twice from two circuits to control the subword line decoders on the left of the block separately from the subword line decoders on the right of the block. A block can include at least one subword line with at least one memory cell connected to the subword line, or the block may include multiple subword lines with each subword line consisting of multiple memory cells, in one example.

By providing separate block select lines based on, in one embodiment, whether the transistor is a p-channel or n-channel transistor, the amount of voltage across the gate to source for the transistors is reduced, which thereby reduces the voltage stress on the transistors in the subword line decoder.

In FIG. 2, for P-channel transistors passing the VPWR potential, limiting the gate potential to no lower than ground (as opposed to as low as VNEG) greatly lowers the potential for degradation, in one example. For N-channel devices passing the VNEG level, limiting its "on" gate potential to no higher than ground would diminish the potential for degradation, in one example. In accordance with one embodiment of the present invention, the gates of the P-channel and N-channel transistors are controlled by separate signals, as shown in FIG. 2. Further, in one embodiment, the P-channel gates are operated between VPWR and ground, and the N-channel gates are operated between ground and VNEG, wherein VNEG is below ground.

The subword line decoder 20 will also provide the output signal 24 along the subword line (SWL) for the read, write, and program operations, as shown in Table 1.

TABLE 1

SWL Output for Subword Line Decoder

| MEMORY OPERATION | | GWL INPUT | BKSN/BKSNB INPUT | bksp/bkspb INPUT | Pwell INPUT | Source INPUT | SWL OUTPUT |
|---|---|---|---|---|---|---|---|
| Read | Select | Vr | +/0 | +/0 | 0 | 0 | Vr |
|  | Desel. | 0 | 0/+ | 0/+ | 0 | 0 | $0_1$ |
| Erase | Select | − | 0/− | +/0 | − | + | − |
|  | Desel. | + | −/0 | 0/+ | − | + | $+_1$ |
| Program | Select | + | 0/− | +/0 | − | − | + |
|  | Desel. | − | −/0 | 0/+ | − | − | $-_1$ |

Note 1:
De-selected SWL gets it voltage from the de-selected GWL input or from the Source input.

Table 1 shows the subword line output (SWL) for a subword line decoder according to one embodiment of the present invention. In Table 1, the entry "0" means ground; the entry "+" means VPWR (such as +5 volts); the entry "−" means the high voltage signal, such as VNEG at −5 volts used to program or erase a memory cell (the VNEG signal may go to 0 volts during a read operation); and the entry "Vr" means a read voltage of between 0 volts and VPWR, in one example.

As shown in Table 1 in the global word line column GWL INPUT and the subword line column SWL OUTPUT, it can be seen that the SWL output of the subword line decoder follows the global word line "GWL" input over the various input combinations shown for the block select lines (BKSN)/(BKSNB) for the n-channel transistors and for the block select lines (bksp)/(bkspb) for the p-channel transistors.

Accordingly, based on the values of these input signals shown in Table 1, the subword line decoder 20 of FIG. 2 produces an output signal 24 on the subword line (SWL) which can be passed to the gate of a memory cell to perform a read, erase or program operation of the memory cell. The output 24 of the subword line decoder 20 is generated, in one example, by the circuit of FIG. 2 without subjecting the transistors P1, N2, N1, or P2 to large gate to source voltages.

Specifically, in FIG. 2, the transistor Pi acts as a pass transistor because, for example, when a voltage of +5 volts is present on the global word line 22 and transistor P1 is on ("bkspb" is low), transistor P1 passes that voltage to the subword line 24. When the global word line 22 is at –5 volts, transistor N1 acts as a pass transistor and passes the –5 volts of the global word line 22 to the subword line 24. Transistors N2 and P2 provide a deselect path which connects the source to the subword line.

For example, if the global word line 22 is at +5 volts during a program operation, then the transistor P1 has a 5 volt bias between its gate and source because the bkspb signal driving the gate of P1 is at 0 volts, in one example. If the global word line 22 is at –5 volts for an erase operation, then transistor N1 has a 5 volt bias between its gate and source because the BKSN signal driving the gate of N1 is at 0 volts, in one example.

Referring to FIG. 2, the P-channel transistors are coupled with signals bksp and bkspb at their gates, and operate between VPWR (i.e., +5 volts) and ground so that when the global word line 22 or source line is at VPWR and is being passed to the subword line 24, transistors P1 and P2 will not have more than the VPWR voltage level (i.e., +5 volts) across the gate oxide of transistors P1 or P2.

Figure 1:
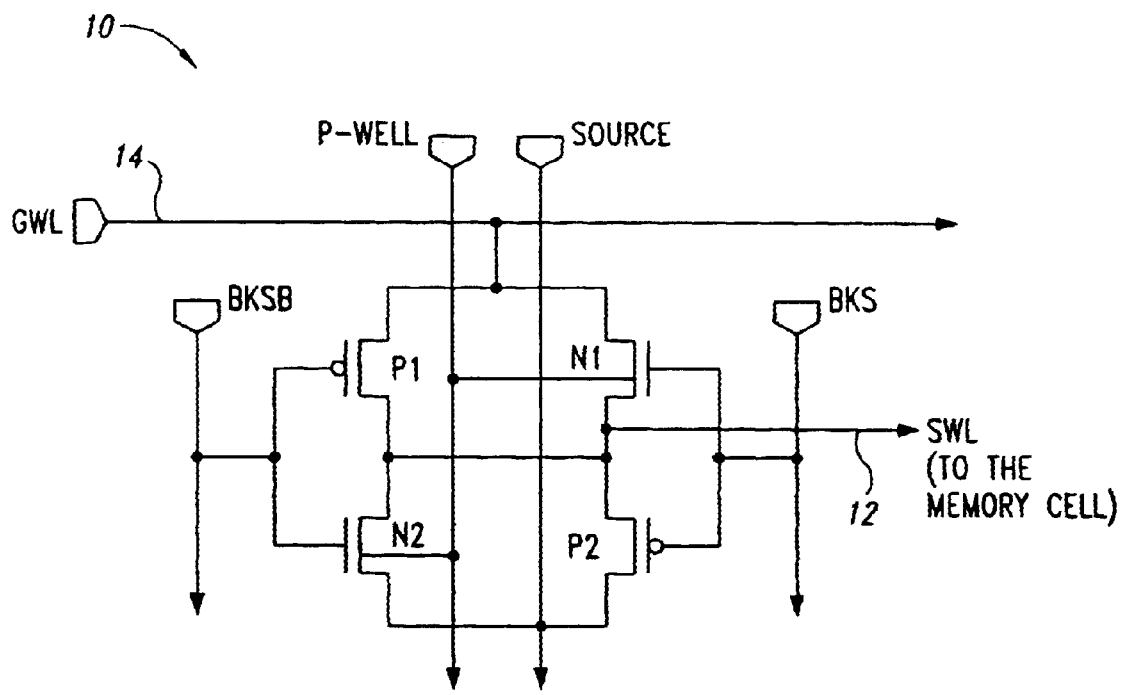
FIG. 1 illustrates a subword line decoder having a first select line controlling transistors P1 and N2, and a second select line controlling transistors N1 and P2.

For instance, during the erase and program modes, the gates of transistors P1 and P2 will swing from zero to 5 volts and the gates of transistors N1 and N2 will swing from –5 volts to zero volts. Accordingly when either transistors P1 or P2 are on with zero volts on their gates and they are passing 5 volts, then only 5 volts is across the gate oxide of transistors P1 or P2, thereby reducing any voltage stresses as compared with the circuit of FIG. 1. Similarly, when either transistors N1 or N2 are on with zero volts on their gates and passing –5 volts, then only five volts is across the gate oxide of either transistors N1 or N2, thereby reducing the voltage stress across these transistors when compared with the implementation of FIG. 1.

Initially, prior to the global word line 22 or the source line going to the VNEG level, the global word line 22 or the source line is at ground and the N-channel gate signals of BKSN and BKSNB operate between VPWR and ground. If the voltage on the global word line 22 is being passed to the subword line 24, the signal line BKSN is at VPWR and BKSNB is at ground.

If the global word line 22 is suppose to go to the VNEG level, then as the global word line 22 slowly slews to the VNEG level, the signal BKSNB, the P-well signal (and possibly the source signal) slew negative with the global word line 22. This insures that transistor N2 stays off in case the source signal is at the VPWR level. The gate of transistor N1 and the signal BKSN stay at the VPWR level; however, if the global word line 22 goes negative, the potential across the transistor N1 (which is on) grows. When the global word line is negative enough (i.e., –2 volts) the signal BKSN switches to ground, and transistor N1 is still on since the gate (BKSN) to source (global word line) potential is greater than transistor N1's threshold.

This reduction in the potential across the gate oxide of transistor N1 reduces the potential for degradation of N1. In a similar manner, transistor N2 can realize a reduced potential across its gate oxide when it passes a negative level from the source line to the subword line 24.

Figure 5:
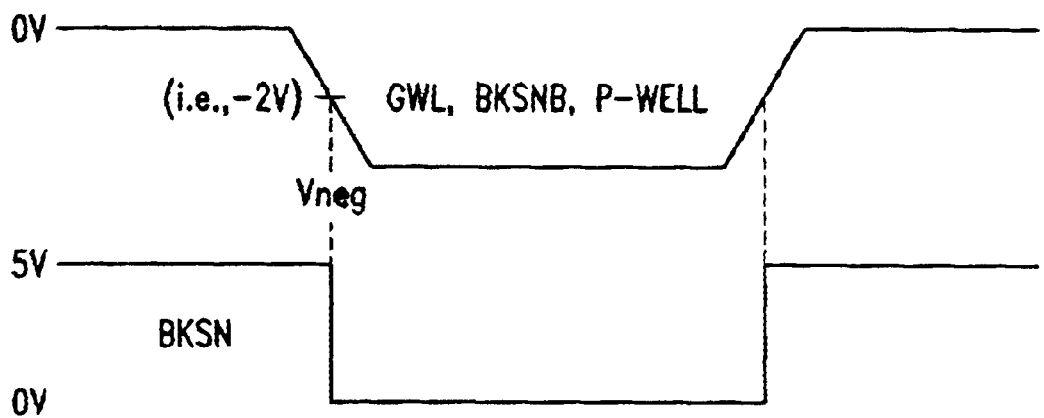
FIG. 5. illustrates an example of a pair of waveforms for the global word line, BKSNB signal, the P-well signal and the BKSN signal, in accordance with one embodiment of the present invention.

Referring now to FIG. 5, an example waveform is shown for the global word line, BKSNB signal or P-well signal, as well as for the BKSN signal. As shown in FIG. 5, when the global word line, BKSNB signal, or the P-well signal go negative to approximately –2 volts, for example, the BKSN signal switches from VPWR (i.e., +5 volts) to ground.

Additionally, the P-channel transistors may have difficulty dealing with higher voltages due to P+ junction breakdown and gated diode breakdown. With regard to P-channel gated diode and P+ junction breakdowns, when a P-channel transistor is off with its source at VPWR and its gate at VPWR, if the drain potential is appreciably negative of the VPWR, the junction on the gate oxide of the drain could breakdown and leak to the N-well. This is known as gated diode breakdown, and can be avoided by limiting the drain side voltage with a cascode circuit, as shown in FIGS. 3–4.

Figure 3:
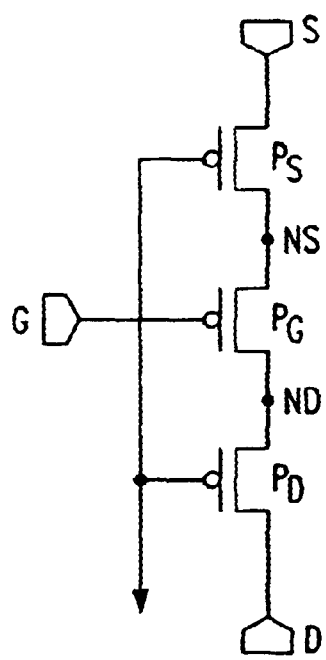
FIG. 3 illustrates a stack of P-channel transistors which can be used as the P-channel transistors shown in FIG. 2 in accordance with one embodiment of the present invention.
Figure 4:
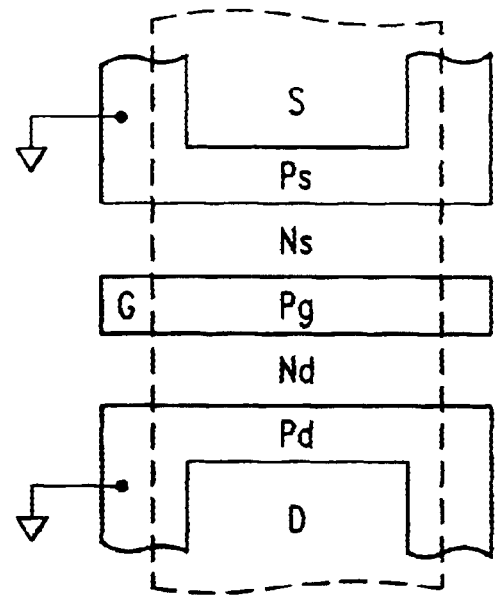
FIG. 4 illustrates a topological view of the stack of transistors of FIG. 3, in accordance with one embodiment of the present invention.

With reference now to FIG. 3, each of the transistors P1 and P2 (shown in FIG. 2) can be configured as shown in FIG. 3, according to one embodiment of the present invention. For example, each of the transistors P1 and P2 can consist of a stack of three P-channel devices wherein a first P-channel transistor is connected in series with a second P-channel transistor which is connected in series with a third P-channel transistor.

In one embodiment, the gates of the first and third P-channel transistors are coupled with ground and the gate of the second P-channel transistor forms the gate for the stack. The source of the first P-channel transistor forms the source for the stack, while the drain of the third P-channel transistor forms the drain for the stack.

The three transistors in the stack are referred to as the source transistor Ps, the gate transistor Pg and the drain transistor Pd. The source transistor and the drain transistor may be provided with rings on the outside to protect against field junction breakdown on the source and drain nodes. To reduce junction breakdown, the source and drain field edge may be completely ringed with the gate of the source transistor and the drain transistor.

To protect the gate transistor from gated diode breakdown, since the gate line can be switched with the VPWR signal, the source and drain transistors are cascode connected with the gates at ground. This arrangement provides that with the source or drain at VNEG, the node NS or node ND are no lower than a positive threshold voltage above ground before the source or drain transistors turn off. Thus, the gate transistor is not subjected to high drain voltages when its gate and source are at the VPWR signal.

FIG. 4 illustrates a topological view of the stack of P-channel transistors shown in FIG. 3. FIG. 4 shows the source transistor, the gate transistor, and the drain transistor, along with the source node, the drain node, and the source, gate, and drain connections.

While embodiments of the present invention have been described with reference to VPWR and a high voltage signal of VNEG being passed to the subword lines by the subword line decoder, the invention can be embodied in a complimentary circuit wherein the subword line decoder passes signals at VGROUND and a high voltage level of VPOS (i.e., +10 volts), or even in a memory where high voltage signals VPOS and VNEG are passed to the subword lines.

The transistors N1 and N2 could be implemented using a stack of N-channel transistors in an manner similar to the P-channel transistor stack previously described with reference to FIGS. 3–4.

Embodiments of the present invention can be used in a variety of memory circuits wherein subword line decoders are used, such as in non-volatile memory devices, programmable logic devices, or high power devices.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. In a semiconductor memory, a circuit for generating an output signal to one or more memory cells of the memory, the output signal corresponding to a global word line input signal, the circuit comprising:
   a first switch having an input coupled with the global word line input signal, the first switch having a control and an output;
   a second switch having an input coupled with the output of the first switch at an output node, the second switch having a control and an output;
   a third switch having an input coupled with the global word line input signal, the third switch having a control and an output, the output of the third switch being coupled with the output of the first switch at the output node;
   a fourth switch having an input coupled with the output of the third switch at the output node, the fourth switch having a control and an output, said output of the fourth switch coupled with the output of the second switch;
   a first block select line coupled with the control of said first switch;
   a second block select line coupled with the control of said fourth switch, the second block select line being a complement of the first block select line;
   a third block select line coupled with the control of said second switch; and
   a fourth block select line coupled with the control of said third switch, the fourth block select line being a complement of the third block select line.

2. The circuit of claim 1, wherein the first switch is a p-channel transistor.

3. The circuit of claim 1, wherein the second switch is a n-channel transistor.

4. The circuit of claim 1, wherein the third switch is a n-channel transistor.

5. The circuit of claim 1, wherein the fourth switch is a p-channel transistor.

6. The circuit of claim 1, wherein
   the first switch includes:
      a first p-channel transistor having a gate, a source and a drain, wherein the source is coupled with the global word line signal and the gate is coupled with a ground;
      a second p-channel transistor having a gate, a source and a drain, wherein the source is coupled with the drain of the first p-channel transistor and the gate is coupled with the first block select line; and
      a third p-channel transistor having a gate, a source and a drain, wherein the source is coupled with the drain of the second p-channel transistor, the gate is coupled with the ground, and the drain is coupled with the input of the second switch;
   and the fourth switch includes:
      a first p-channel transistor having a gate, a source and a drain, wherein the source is coupled with the output of the third switch and the gate is coupled with the ground;
      a second p-channel transistor having a gate, a source and a drain, wherein the source is coupled with the drain of the first p-channel transistor of the fourth switch and the gate is coupled with the first block select line; and
      a third p-channel transistor having a gate, a source and a drain, wherein the source is coupled with the drain of the second p-channel transistor of the fourth switch, the gate is coupled with the ground, and the drain is coupled with the output of the second switch.

7. A circuit for generating an output signal for one or more memory cells of the memory, the circuit comprising:
   a first switch having an input coupled with an input signal, the first switch having a control and an output;
   a second switch having an input coupled with the output of the first switch at an output node, the second switch having a control and an output;
   a third switch having an input coupled with the input signal, the third switch having a control and an output, the output of the third switch being coupled with the output of the first switch at the output node;
   a fourth switch having an input coupled with the output of the third switch at the output node, the fourth switch having a control and an output, said output of the fourth switch coupled with the output of the second switch;
   a first block select line coupled with the control of said first switch;
   a second block select line coupled with the control of said fourth switch, the second block select line being a complement of the first block select line;
   a third block select line coupled with the control of said second switch; and
   a fourth block select line coupled with the control of said third switch, the fourth block select line being a complement of the third block select line.

8. The circuit of claim 7, wherein the first switch is a p-channel transistor.

9. The circuit of claim 7, wherein the second switch is a n-channel transistor.

10. The circuit of claim 7, wherein the third switch is a n-channel transistor.

11. The circuit of claim 7, wherein the fourth switch is a p-channel transistor.

12. The circuit of claim 7, wherein
   the first switch includes:
      a first p-channel transistor having a gate, a source and a drain, wherein the source is coupled with the input signal and the gate is coupled with a ground;
      a second p-channel transistor having a-gate, a source and a drain, wherein the source is coupled with the drain of the first p-channel transistor and the gate is coupled with the first block select line; and
      a third p-channel transistor having a gate, a source and a drain, wherein the source is coupled with the drain of the second p-channel transistor, the gate is coupled with the ground, and the drain is coupled with the input of the second switch;

and the fourth switch includes:
  a first p-channel transistor having a gate, a source and a drain, wherein the source is coupled with the output of the third switch and the gate is coupled with the ground;
  a second p-channel transistor having a gate, a source and a drain, wherein the source is coupled with the drain of the first p-channel transistor of the fourth switch and the gate is coupled with the first block select line; and
  a third p-channel transistor having a gate, a source and a drain, wherein the source is coupled with the drain of the second p-channel transistor of the fourth switch, the gate is coupled with the ground, and the drain is coupled with the output of the second switch.

* * * * *